(12) United States Patent
Rothaar et al.

(10) Patent No.: US 8,605,764 B1
(45) Date of Patent: Dec. 10, 2013

(54) LASER DIODE JUNCTION TEMPERATURE COMPENSATION

(75) Inventors: Bruce C. Rothaar, Woodinville, WA (US); Dale Eugene Zimmerman, Redmond, WA (US); Joel Sandgathe, Portland, OR (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 13/544,556

(22) Filed: Jul. 9, 2012

(51) Int. Cl.
*H01S 3/00* (2006.01)

(52) U.S. Cl.
USPC ......... 372/38.02; 372/38.01; 372/29.021; 372/29.02; 372/29.011; 372/29.01

(58) Field of Classification Search
USPC ............. 372/38.02, 38.01, 29.021, 29.02, 372/29.011, 29.01
See application file for complete search history.

(56) References Cited

U.S. PATENT DOCUMENTS

| | | | |
|---|---|---|---|
| 6,542,044 B1 * | 4/2003 | Berquist et al. | 331/176 |
| 7,940,821 B2 | 5/2011 | Shin | |
| 2009/0028199 A1 * | 1/2009 | Brown et al. | 372/38.01 |
| 2011/0181791 A1 * | 7/2011 | Huang et al. | 348/744 |

* cited by examiner

*Primary Examiner* — Kinam Park
(74) *Attorney, Agent, or Firm* — Kevin D. Wills (57) ABSTRACT

A projection apparatus includes at least one laser diode and a laser diode junction temperature estimator to estimate the junction temperature of the at least one laser diode. Laser diode current drive values are modified in response to the estimated laser junction temperature. The modification of laser diode current drive values may occur as frequently as once per pixel.

17 Claims, 10 Drawing Sheets

LASER DIODE JUNCTION TEMPERATURE COMPENSATION

FIELD

The present invention relates generally to laser light sources, and more specifically to calibration of laser light sources.

BACKGROUND

The amount of light produced by laser light sources used in projectors may vary over time based on factors such as age and temperature. In an attempt to overcome these variations, laser light sources may be "calibrated" periodically to determine their operating characteristics, and then laser light source drive values can be adjusted accordingly. One method of calibration includes periodically driving the laser light source with a known value (sometimes referred to as a "calibration value" or a "calibration pulse") and measuring the actual amount of light produced.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
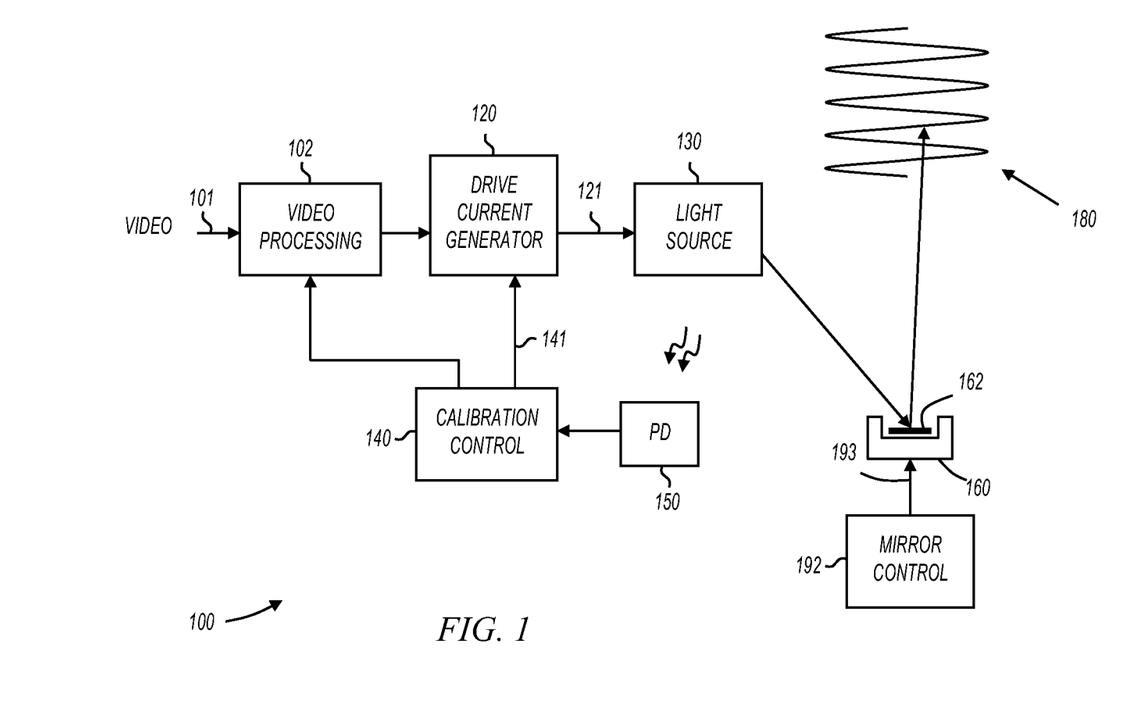
FIG. 1 shows a projection apparatus with calibration in accordance with various embodiments of the present invention.

FIG. 1 shows a projection apparatus with calibration in accordance with various embodiments of the present invention. Apparatus 100 includes video processing component 102, drive current generator component 120, light source 130, microelectromechanical machine (MEMS) device 160 having scanning mirror 162, mirror control circuit 192, photodetector 150, and calibration control circuits 140.

In operation, video processing component 102 receives video data on node 101 and produces display pixel data representing luminance values of pixels that are to be displayed. The video data 101 represents image source data that is typically received with pixel data on a rectilinear grid, but this is not essential. For example, video data 101 may represent a grid of pixels at any resolution (e.g., 640×480, 848×480, 1280×720, 1920×1080). Projection apparatus 100 is a scanning projector that scans a raster pattern. The raster pattern does not necessarily align with the rectilinear grid in the image source data, and video processing component 102 operates to produce display pixel data that will be displayed at appropriate points on the raster pattern. For example, in some embodiments, video processing component 102 interpolates vertically and/or horizontally between pixels in the source image data to determine display pixel values along the scan trajectory of the raster pattern.

Video processing component 102 may include any circuitry capable of performing the functions described. For example, in some embodiments, video processing component 102 includes digital circuits capable of performing interpolation such as multipliers, shifters, and adders. Also for example, in some embodiments, video processing component 102 may include hardware circuits and may also include a processor that executes instructions.

Drive current generator component 120 receives luminance values from video processing component 102, and maps the luminance values to drive current values to drive light source 130. In some embodiments, drive current generator component 120 includes a look-up table that maps luminance values to current values, and also includes one or more components to estimate an internal temperature of light source 130, and adjusts the drive current value accordingly. Drive current generator component 120 may also include a digital-to-analog converter (DAC) to convert digital current values to analog currents. In some embodiments, drive current generator component 120 is also responsive to gain and offset values provided by calibration control component 140 on node 141. The gain and offset values on node 141 are determined during a calibration period. Calibration is described further below. Gain and offset calibration allows for the creation of a luminance-to-current (L/I) curve (a model) of the laser diode for any temperature that is based on a stored (measured) L/I curve at some specific temperature. Then the model is used (by way of a table lookup) to predict how much drive current will be required for each pixel.

Light source 130 receives drive current values from drive current generator component 120 and produces light having grayscale values in response thereto. Light source 130 may be monochrome or may include multiple different color light sources. For example, in some embodiments, light source 130 includes red, green, and blue light sources. In these embodiments, video processing component 102 outputs display pixel data corresponding to each of the red, green, and blue light sources. Also for example, light produced by light source 130 may be visible or nonvisible. For example, in some embodiments, one or more sources of light within light source 130 may produce infrared (IR) light. In some embodiments, light source 130 may include one or more laser light producing devices. For example, in some embodiments, the light source 130 may include laser diodes. In these embodiments, drive current generator 120 estimates at least one laser diode junction temperature, and modifies the drive current values on node 121 in response thereto.

The light from light source 130 is directed to mirror 162. In some embodiments, additional optical elements are included in the light path between light source 130 and mirror 162. For example, apparatus 100 may include collimating lenses, dichroic mirrors, or any other suitable optical elements.

Scanning mirror 162 deflects on two axes in response to electrical stimuli received on node 193 from mirror control circuits 192. While moving on the two axes, scanning mirror 162 reflects light provided by light source 130. The reflected light sweeps a raster pattern and creates a resultant display in an image plane at 180. The shape of the raster pattern swept by scanning mirror 162 is a function of the mirror movement on its two axes. For example, in some embodiments, scanning mirror 162 sweeps in a first dimension (e.g., vertical dimension) in response to sawtooth wave stimulus, resulting in a substantially linear and unidirectional vertical sweep. Also for example, in some embodiments, scanning mirror 162 sweeps in a second dimension (e.g., horizontal dimension) according to a sinusoidal stimulus, resulting in a substantially sinusoidal horizontal sweep. An example of this type of mirror movement is described more fully below with reference to FIG. 2.

MEMS device 160 is an example of a scanning mirror assembly that scans light in two dimensions. In some embodiments the scanning mirror assembly includes a single mirror that scans in two dimensions (e.g., on two axes). Alternatively, in some embodiments, MEMS device 160 may be an assembly that includes two scan mirrors, one which deflects the beam along one axis, and another which deflects the beam along a second axis largely perpendicular to the first axis.

Photodetector 150 is a light measurement device that measures the amount of light power produced by light source 130. Photodetector 150 may be placed anywhere in projection system 100 to accomplish this function. For example, in some embodiments, photodetector 150 is placed in the light path near light source 130, and in other embodiments, photodetector 150 is placed in the light path near scanning mirror 162. Further, in some embodiments, multiple photodetectors are employed. Examples are described more fully below.

Calibration control circuits 140 function to calibrate light source 130 by commanding a known luminance value, measuring actual optical power, and then generating gain and offset values on node 141 to compensate for the difference. Calibration control circuits 140 may include any circuitry capable of performing the functions described. For example, in some embodiments, calibration control circuits 140 include digital state machines that control the calibration process. Further, in some embodiments, calibration control circuits 140 include a processor that executes instructions stored in a memory device.

One of the challenges often faced with controlling laser light sources is the ability to accurately produce the desired level of optical power, particularly when accounting for factors such as time and temperature. Various embodiments of the present invention provide laser diode junction temperature compensation in addition to a calibration mechanism to overcome these challenges. For example, calibration control circuits 140 may perform calibration operations periodically and generate calibration data that compensates for slower variations in laser diode behavior, while drive current generator 120 may estimate laser diode junction temperatures and provide compensation for much faster variations in laser diode behavior.

Calibration control circuits 140 may periodically command video processing component 102 to output known luminance values, which in turn result in light source 130 producing calibration pulses. Photodetector 150 may then measure the optical power produced as a result of the calibration pulses and provide the optical power information to calibration control circuits 140. Calibration control circuits 140 may then modify compensation data on node 141 to compensate for operating characteristic variations of light source 130.

In some embodiments, calibration pulses are provided for a single luminance value, corresponding to a single point on the curve that represents the current operating characteristic of light source 130. This calibration pulse may be commanded to any level. In other embodiments, calibration pulses are provided for multiple luminance values, corresponding to multiple points on the curve that represents the current operating characteristic of light source 130. Calibration control circuits 140 may then perform a curve fitting operation to determine the calibration data to be provided on node 141.

In some embodiments, calibration is performed during periods in which the projected light is less likely to distract a viewer. For example, in a bidirectional raster scanned display incorporating a linear vertical ramp drive, calibration may be performed during the horizontal overscan or vertical overscan.

In other embodiments, calibration does not make use of pulses, but rather measures light produced over an integration time period, such as one video line or one video frame. In these embodiments, calibration control circuits 140 may periodically update calibration data on node 141 without the necessity of driving the light source 130 with calibration pulses.

Although the various embodiments of the present invention are described with reference to projection devices such as projection apparatus 100, this is not a limitation of the present invention. For example, any device that modulates laser light may benefit from implementing the various embodiments of the present invention.

Figure 2:
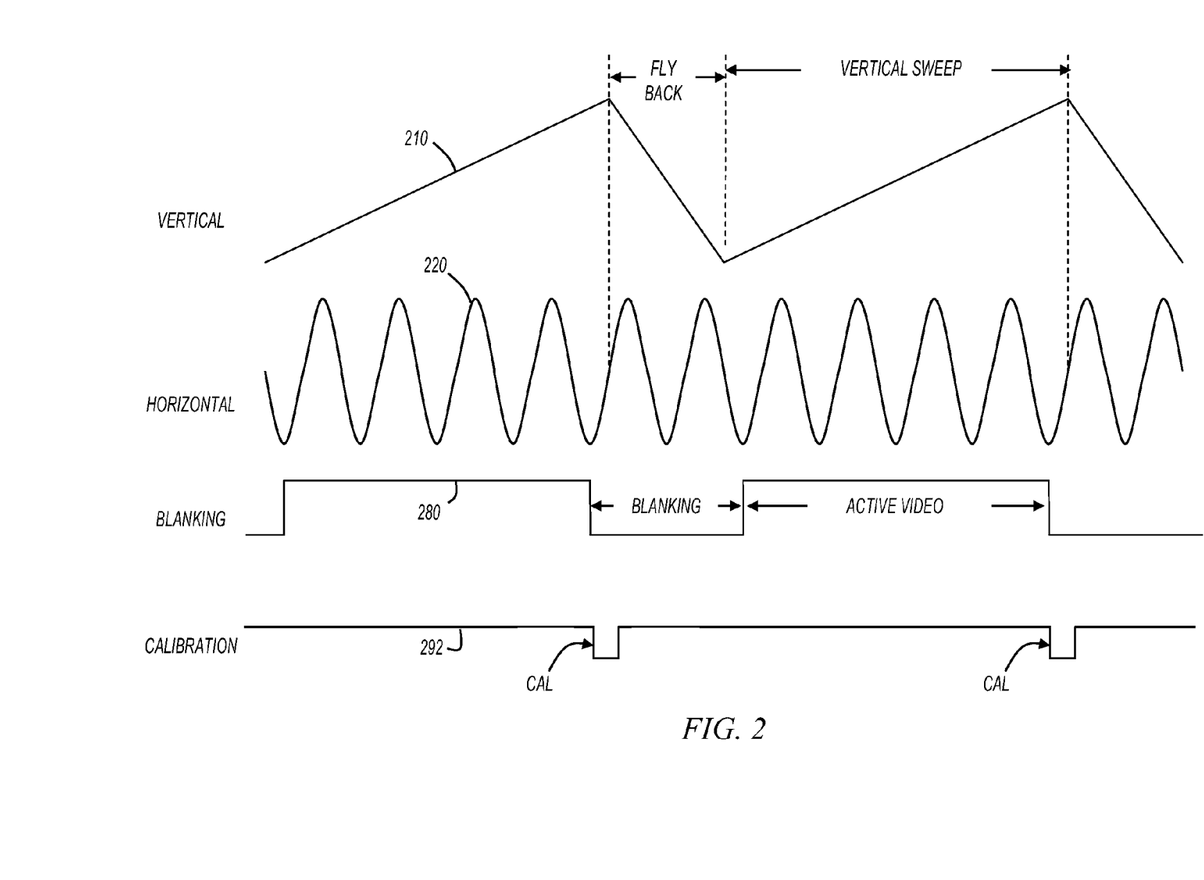
FIG. 2 shows a relationship between scanning deflection waveforms, video blanking, and calibration in accordance with various embodiments of the present invention.

FIG. 2 shows a relationship between scanning deflection waveforms, video blanking, and calibration in accordance with various embodiments of the present invention. Vertical deflection waveform 210 is a sawtooth waveform, and horizontal deflection waveform 220 is a sinusoidal waveform. When mirror 162 is deflected on its vertical and horizontal axes according to the waveforms 210 and 220, the scanned beam trajectory shown in FIG. 1 results.

Deflection of mirror 162 according to waveforms 210 and 220 may be achieved by driving MEMS device 160 with the appropriate drive signals. In some embodiments, the horizontal deflection frequency is at a resonant frequency of the mirror and a very small excitation at that frequency will result in the desired scan angle. A sawtooth drive signal for the vertical deflection may be derived from a sum of sine waves at various frequencies. The drive signal for the vertical deflection may also be derived from specific points programmed into a waveform generator.

Although a sawtooth drive signal will result in the vertical deflection shown in FIG. 2, other drive signal embodiments exist. For example, in some embodiments, the vertical drive signal may be triangle wave (where subsequent frames are written top to bottom followed by bottom to top alternating each frame) or sinusoidal waveforms.

Sawtooth vertical deflection waveform 210 includes vertical sweep portions and flyback portions. In some embodiments, pixels are displayed during the vertical sweep portions, and not during the flyback portions. The flyback portions correspond to the beam "flying back" to the top of the image field of view. Blanking waveform 280 is also shown in FIG. 2. The scanned beam is blanked (no pixels are displayed) during flyback, and is not blanked during the vertical sweep.

In some embodiments, calibration is performed during a vertical overscan period as shown at 292. In some embodiments, multiple calibration pulses are generated during the vertical overscan time. Further, in some embodiments, multiple calibration pulses are fired for each color (e.g., red, green, blue). In other embodiments, one color is calibrated during each vertical overscan period.

Calibration operation is shown during vertical overscan periods in FIG. 2, although this is not a limitation of the present invention. For example, in some embodiments, calibration is performed during horizontal overscan periods. This corresponds to times at which waveform 220 is at peaks and troughs. In still further embodiments, calibration is performed during video display by integrating measured light output during the vertical sweep.

For clarity of explanation, FIG. 2 shows only a few horizontal cycles per vertical sweep. In practice, many more horizontal cycles are present. For example, a horizontal resonant frequency of 24.5 kHz and a frame rate of 60 Hz will yield about 408 horizontal cycles per vertical sweep.

Figure 3:
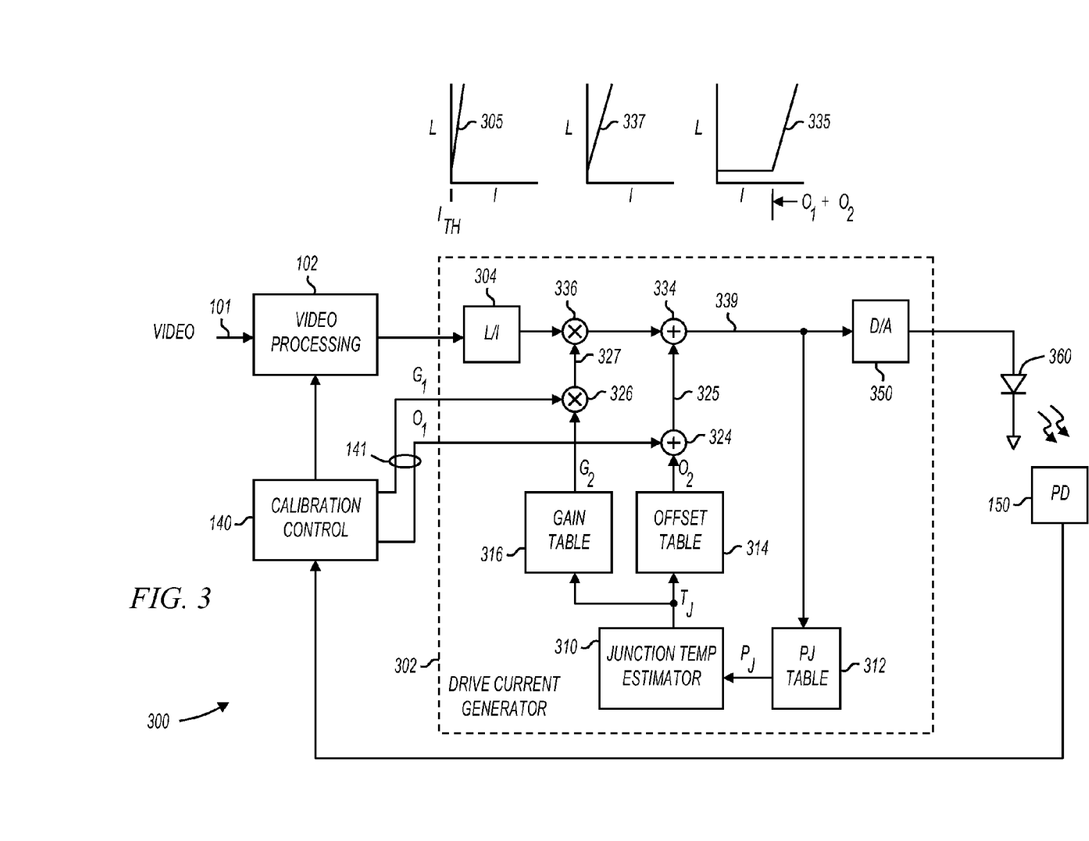
FIG. 3 shows a projection apparatus having a drive current generator with a laser diode junction temperature estimator in accordance with various embodiments of the present invention.

FIG. 3 shows a projection apparatus having a drive current generator with a laser diode junction temperature estimator in accordance with various embodiments of the present invention.

Projection apparatus 300 includes video processing component 102, calibration component 140, and photodetector 150, all of which are described above with reference to earlier figures. Projection apparatus 300 also includes drive current generator component 302 and laser diode 360. Drive current generator component 302 represents example embodiments of drive current generator 120 (FIG. 1), and laser diode 360 is an example of a light source 130 (FIG. 1). Laser diode 360 is coupled to be responsive to a drive signal provided by drive current generator 302.

Calibration control circuits 140 and photodetector 150 are part of a calibration loop that operates as described above with reference to FIGS. 1 and 2. The calibration loop determines gain and offset terms $G_1$ and $O_1$ on node 141. Node 141 may include any number of signal lines to carry digital data. In some embodiments, $G_1$ and $O_1$ provide a coarse calibration function based on data collected less frequently than on a pixel by pixel basis. For example, calibration may be performed on a frame by frame basis during the vertical overscan as shown in FIG. 2.

Drive current generator 302 includes luminance-to-current (L/I) mapping component 304, digital-to-analog (D/A) converter 350, power table 312, junction temperature estimator 310, gain table 316, offset table 314, adders 324, 334, and multipliers 336, 334.

Drive current generator 302 determines a drive current value for laser diode 360 for each pixel to be displayed based on the commanded luminance value provided by video processing component 102 and the gain and offset provided by calibration circuit 140. In some embodiments, drive current generator 302 estimates the junction temperature of laser diode 360 on a pixel by pixel basis and modifies the laser diode drive value as a function of the junction temperature estimate to compensate for variations in laser diode light output as a function of junction temperature. Embodiments of drive current generator 302 are more fully described below.

Luminance-to-current mapping component 304 receives the commanded luminance values from video processing component 102 and maps them to nominal drive values. In some embodiments, L/I component 304 only includes output values that represent drive values above the laser diode threshold current $I_{TH}$ as show at 305.

Multiplier 336 modifies the nominal drive value provided by L/I component 304 by multiplying it with a gain value provided on node 327. This changes the slope of the L/I curve above the threshold current as shown at 337. Adder 334 sums an offset provided on node 325 with the output of multiplier 336 to produce the final laser diode drive value for each pixel on node 339. This shifts the L/I curve to the right by an amount equal to $O_1+O_2$ as shown at 335. The final laser diode drive value for each pixel is converted from a digital value to an analog current by D/A 350. The output of D/A 350 drives laser diode 360.

The final laser diode drive value for each pixel on node 339 is also input to power table 312. Power table 312 maps the laser diode drive value to a power value $P_J$. The power value $P_J$ represents the power deposited at the laser diode junction when the diode is driven with the corresponding laser diode drive current. In some embodiments, power table 312 is a one-dimensional table as shown in FIG. 3, where the deposited power is only a function of the laser drive value. In other embodiments, power table 312 is a multi-dimensional table where the deposited power is a function of more than one input variable. For example, deposited power may be a function of any combination of laser drive value, laser diode voltage, ambient temperature, or the like.

In some embodiments, power table 312 is implemented as a look up table. For example, a solid state memory device may be programmed with a table of values, and the address lines of the memory device may be driven with a digital word representing the final laser diode drive value. The data read out from the memory device represents the power that will be deposited at the laser diode junction as a result of driving the laser diode with the final laser diode drive value on node 339.

Junction temperature estimator 310 estimates the junction temperature of laser diode 360 based on previous junction temperature estimates, previous drive current drive values, heat sink characteristics of the laser diode, and light emitted from the laser diode junction. In some embodiments, junction temperature estimator 310 estimates a new junction temperature for each pixel to be displayed. For example, one or more infinite impulse response filters may sum a previous temperature estimate with a positive term that represents a heat increase due to previous pixel current drive value(s) and with a negative term that represents heat dissipation over one or more pixel times. One example is:

$$T_J[n]=T_J[n-1]+\alpha P_J[n-1]\beta(T[n-1]-T_{AMB})-\delta E[n-1] \quad (1)$$

where n is a pixel number, $T_J[n]$ is the junction temperature estimate for the current pixel, $T_J[n-1]$ is the junction temperature estimate for the previous pixel, $\alpha P_J[n-1]$ is the temperature increase due to power deposited at the junction from the previous pixel, $\beta(T[n-1]-T_{AMB})$ is the temperature decrease due to heat dissipation, and $\delta E[n-1]$ is the temperature decrease due to light emitted from the diode junction. In the example of equation (1), $T_{AMB}$ is the ambient temperature, $\alpha$ is a coefficient that scales power to temperature, and $\beta$ is a coefficient related to the thermal characteristics of laser diode

360 and its packaging/mounting, and δ is a coefficient that scales emitted light to temperature. In some embodiments, α, β and/or δ are constants, and in other embodiments, α, β and/or δ are not constants. For example, in some embodiments, α, β and/or δ may be software programmable, functions of other variables, or adaptive coefficients.

The example of equation (3) estimates the junction temperature for the current pixel [n] as a function of only the most recent estimate [n−1] and the drive value for only the most recent pixel [n−1], although this is not a limitation of the present invention. For example, a more general expression for the junction temperature estimate may include terms based on older samples [n−k], where k is greater than one.

Gain table 316 maps the laser junction temperature estimate $T_J$ to a gain value $G_2$. In some embodiments, gain table 316 is implemented as a look up table. For example, a solid state memory device may be programmed with a table of values, and the address lines of the memory device may be driven with a digital word representing the laser diode junction temperature estimate. The data read out from the memory device represents the gain term that will be applied for any given temperature.

The contents of gain table 316 may be determined in any manner. For example, in some embodiments, the gain behavior of laser diode 360 may be characterized over temperature at the time of manufacture, and the characterization results may be loaded into gain table 316. Also for example, the gain behavior of laser diode 360 may be characterized at any other time, including periodically during operation, and the characterization results may be loaded into gain table 316.

Offset table 314 maps the laser junction temperature estimate to an offset value $O_2$. In some embodiments, offset table 314 is implemented as a look up table. For example, a solid state memory device may be programmed with a table of values, and the address lines of the memory device may be driven with a digital word representing the laser diode junction temperature estimate. The data read out from the memory device represents the offset term that will be applied for any given temperature.

The contents of offset table 314 may be determined in any manner. For example, in some embodiments, the offset behavior of laser diode 360 may be characterized over temperature at the time of manufacture, and the characterization results may be loaded into offset table 314. Also for example, the offset behavior of laser diode 360 may be characterized at any other time, including periodically during operation, and the characterization results may be loaded into offset table 314.

Multiplier 326 multiplies the two gain terms $G_1$ and $G_2$ and the result is provided to multiplier 336 on node 327. Adder 324 sums the two offset terms $O_1$ and $O_2$ and the result is provided to adder 334 on node 325.

As shown in FIG. 3, projection apparatus 300 includes at least one device that includes a table of values used to modify the drive signal as a function of the junction temperatures, and in some embodiments, the junction temperature estimate is determined as a function of past drive signal values. The table of values may include a power table, a gain table, an offset table, or any combination.

Further, as shown in FIG. 3 and described above, in some embodiments, the drive current generator creates the drive current values from calibration data determined from a calibration sequence that occurs less frequently than every pixel and from a junction temperature estimator that estimates a junction temperature of a laser diode for every pixel.

Figure 4:
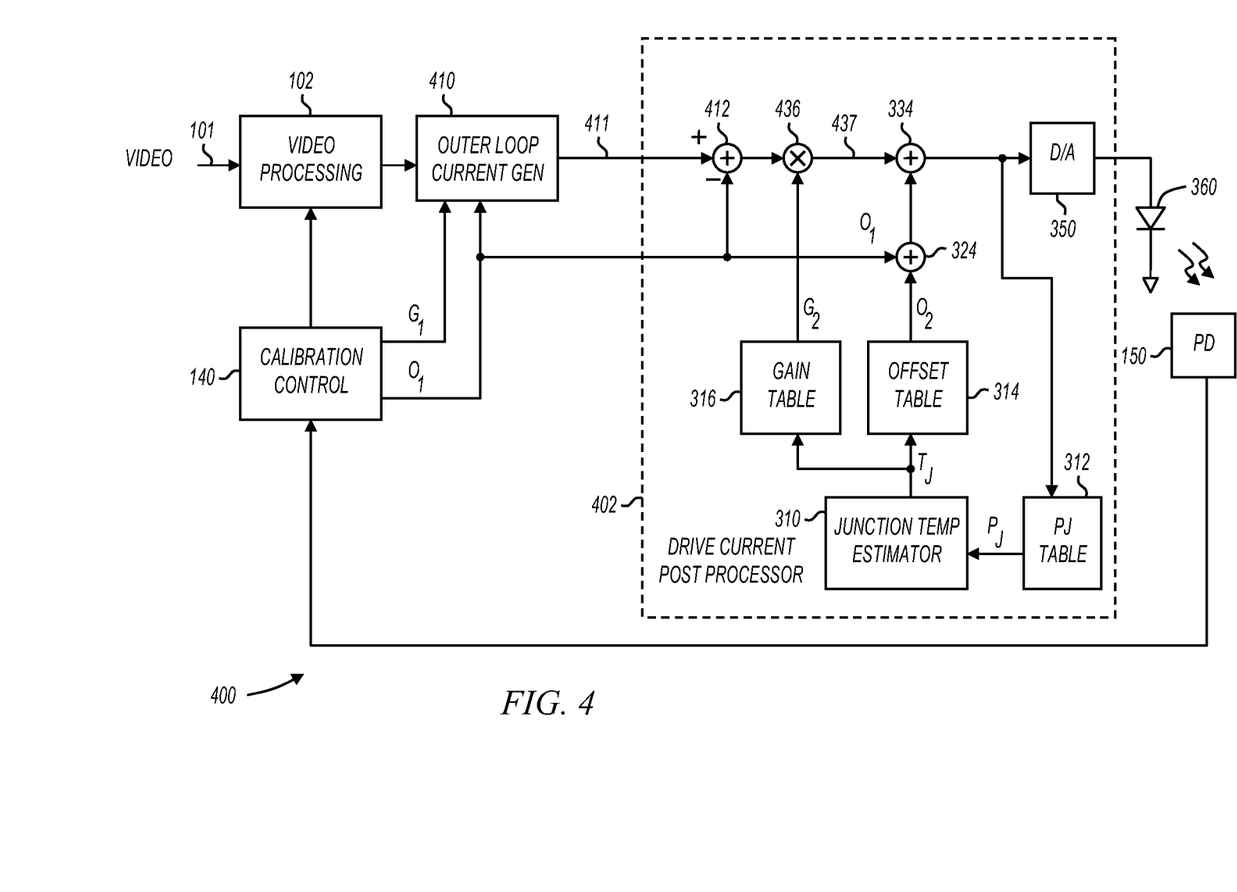
FIGS. 4 and 5 show projection apparatus having laser diode drive current post processors in accordance with various embodiments of the present invention.

FIG. 4 shows a projection apparatus having a laser diode drive current post processor in accordance with various embodiments of the present invention. Projection apparatus 400 includes video processing component 102, calibration control circuits 140, laser diode 360, and photodetector 150, all of which are described above with reference to earlier figures. Projection apparatus 400 also includes outer loop drive current generator 410 and drive current post processor 402.

In some embodiments, drive current post processor 402 may be added to a system that already includes a drive current generator that utilizes calibration data provided by calibration control circuits 140. For example, if drive current post processor 402 is omitted from apparatus 400, then laser diode 360 may be driven directly by the drive current value on node 411 which is output from outer loop drive current generator 410. In these embodiments, the laser diode drive current values are modified by the calibration values $G_1$ and $O_1$, but are not modified as a function of the laser diode junction temperature estimate. In embodiments that include drive current post processor 402, the drive current values produced by outer loop current generator 410 are not only modified by the calibration values $G_1$ and $O_1$, they are further modified based on the laser diode junction temperature estimate. In some embodiments, this includes removing the effects of at least some of the calibration, and then modifying the drive current values as a function of calibration data as well as the junction temperature estimate. This is described further below.

Outer loop drive current generator 410 receives a commanded luminance value from video processing component 102 and produces a laser diode drive value on node 411. In some embodiments, outer loop drive current generator 410 includes an L/I component similar to L/I component 304 (FIG. 3) to map the commanded luminance value to a nominal drive current value, and also includes a multiplier to scale the nominal drive current value by $G_1$ and an adder to sum the result with $O_1$.

Accordingly, the drive current value on node 411 has been modified by the calibration data $G_1$ and $O_1$, but has not been modified as a function of the laser diode junction temperature estimate.

Drive current post processor 402 is an apparatus that removes at least some of the luminance-to-current calibration effects of $G_1$ and $O_1$ from the laser diode drive signal on node 411, estimates the junction temperature of laser diode 360 as a function of past laser diode drive signal values, and then modifies the laser diode drive signal value in response to the laser diode junction temperature estimate.

Drive current post processor 402 includes junction temperature estimator 310, gain table 316, offset table 314, power table 312, D/A 350, and adders 324, 334, all of which are described above with reference to earlier figures. Drive current post processor 402 also includes subtractor 412 and multiplier 436.

Subtractor 412 subtracts the offset $O_1$ from the drive current value on node 411. This removes at least part of the luminance-to-current calibration effects of calibration control circuits 140 and outer loop drive current generator 410. Multiplier 436 multiplies the output of subtractor 412 with the gain value $G_2$ provided by gain table 316. The modified laser diode drive value on node 437 includes the gain effects from gain values from $G_1$ and $G_2$, but does not include offset effects from $O_1$ and $O_2$. Adder 334 sums the modified laser drive value on node 437 with $O_1$ and $O_2$ and processing proceeds as described above with reference to FIG. 3.

Figure 5:
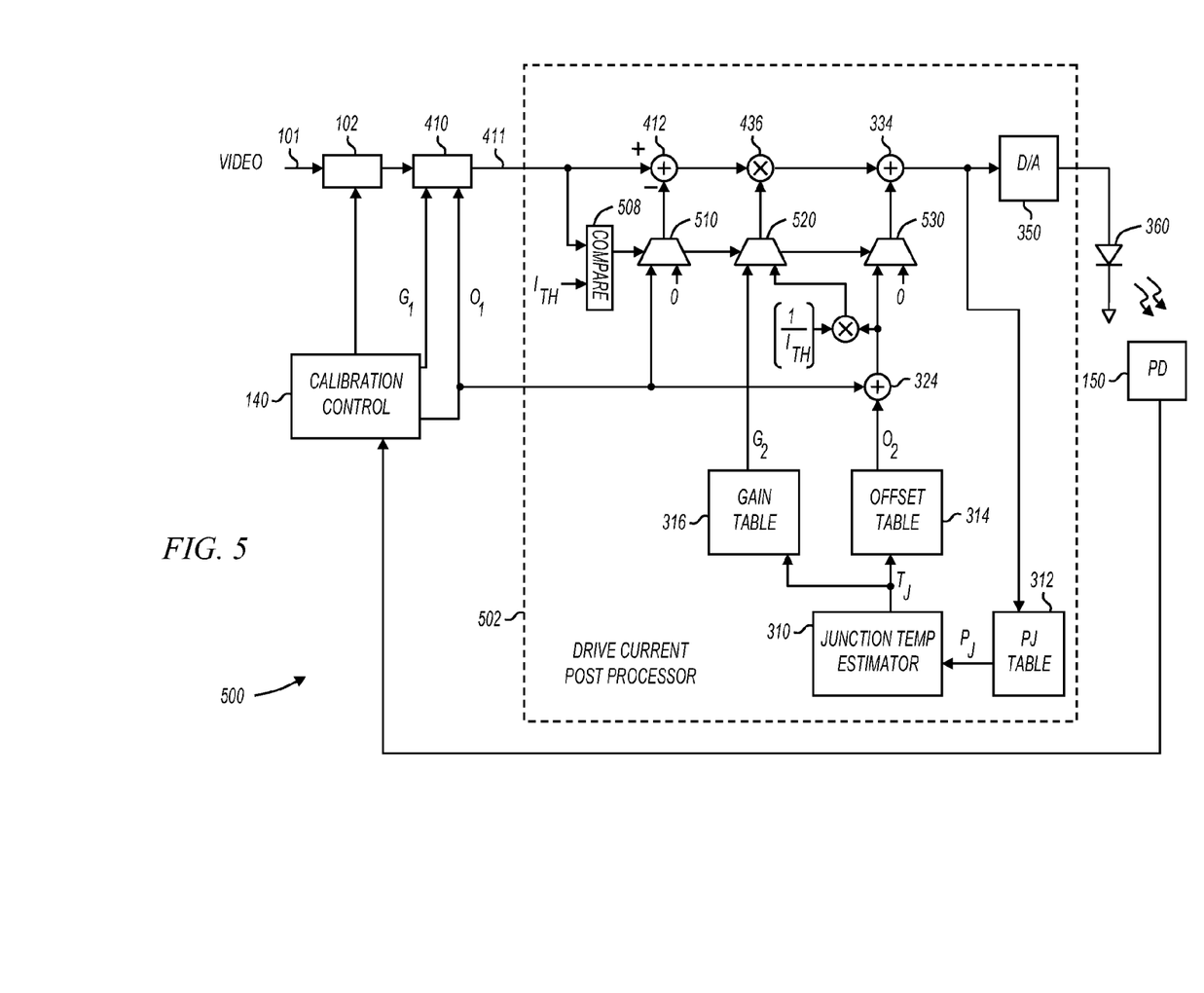

FIG. 5 shows a projection apparatus having a laser diode drive current post processor in accordance with various embodiments of the present invention. Projection apparatus 500 includes all the elements shown in apparatus 400 (FIG.

4), with the exception of drive current post processor 502. Drive current post processor 520 includes comparator 508, and multiplexors 510, 520, 530, in addition to the components shown in drive current post processor 402.

In operation, comparator 508 compares the drive value on node 411 with a reference drive value (shown as $I_{TH}$ in FIG. 5), and then operates multiplexors 510, 520, and 530 in response thereto. In some embodiments, when the drive value on node 411 is greater than the threshold current $I_{TH}$, the multiplexors select the inputs shown on the left, and drive current post processor 502 operates the same as drive current post processor 402 (FIG. 4). In contrast, when the drive value on node 411 is less than the diode threshold current $I_{TH}$, then the values shown on the right side of the multiplexors are chosen. When this occurs, drive current post processor 502 multiplies the drive current value on node 411 by the product of the output of multiplier 324 and the inverse of $I_{TH}$. This "stretches the L/I curve to drive the laser diode with a current value that is close to the actual threshold current value.

Figure 6:
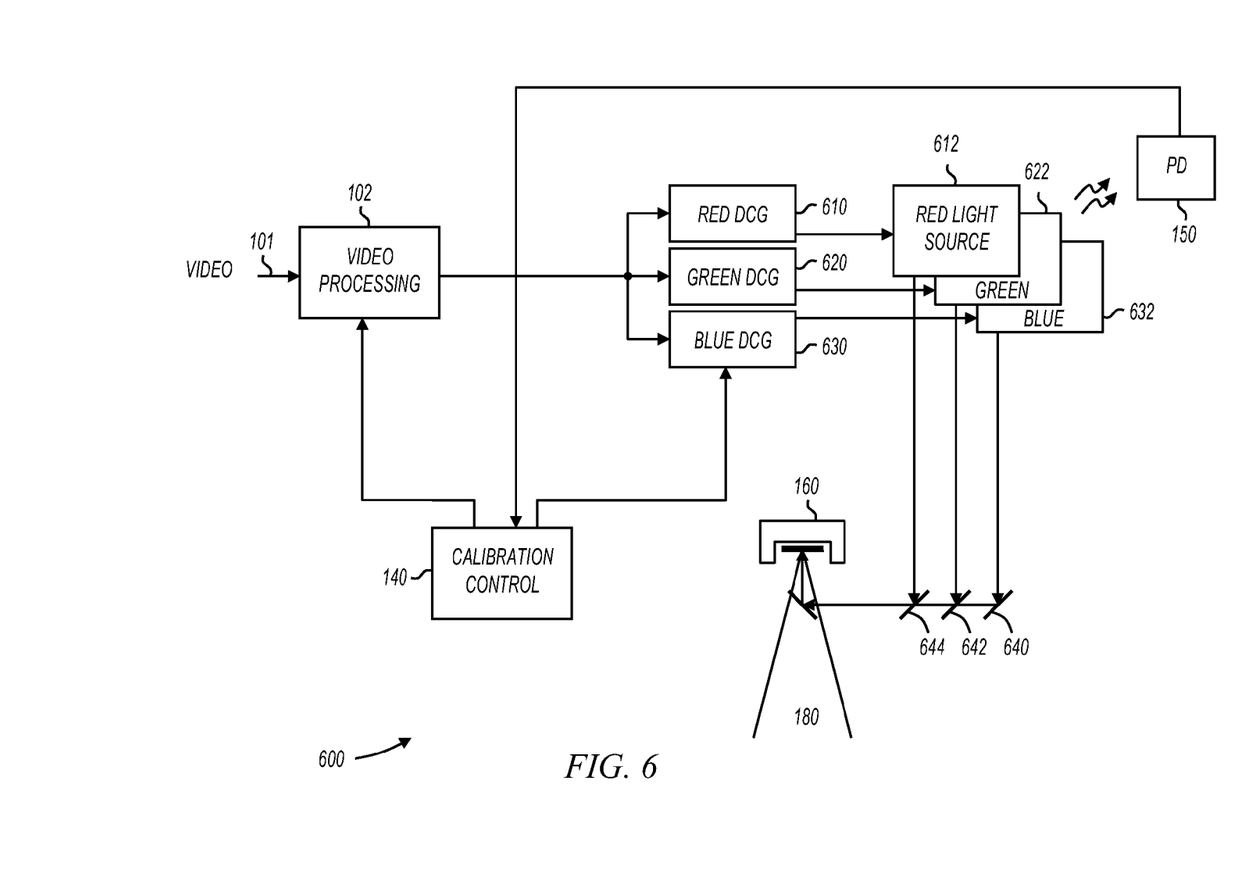
FIG. 6 shows a color laser projector in accordance with various embodiments of the present invention.

FIG. 6 shows a color laser projector in accordance with various embodiments of the present invention. Color laser projector 600 includes video processing component 102, calibration control circuits 140, photodetector 150, and MEMs device 160, all of which are described above with reference to earlier figures. Color laser projector 600 also includes red light source 612, green light source 622, blue light source 632, red drive current generator (DCG) 610, green drive current generator 620, blue drive current generator 630, and optical devices 640, 642, and 644.

Red light source 612 is coupled to be driven by a value produced by red drive current generator 610, green light source 622 is coupled to be driven by a value produced by green drive current generator 620, and blue light source 630 is coupled to be driven by a value produced by blue drive current generator 630.

Red, green, and blue drive current generators 610, 620, 630, may include any of the drive current generator embodiments described herein. For example, they may include embodiments shown in FIGS. 3, 4, and/or 5. Also for example, red, green, and blue drive current generators 610, 620, and 630 each may include a combination of an outer loop current generator and a drive current post processor as shown in FIGS. 4 and 5.

Light sources 612, 622, and 632 include laser diodes having current to luminance characteristics that vary as a function of junction temperature. Each of the DCGs 610, 620, and 630 estimate the junction temperature for the corresponding laser diode and adjust the drive value accordingly.

Optical devices 640, 642, and 644 operate to combine the light output from the light sources, and may include any suitable combination of devices to accomplish this result. For example, the optical devices may include dichroic mirrors, lenses, prisms, or any other suitable type of optical device.

Figure 7:
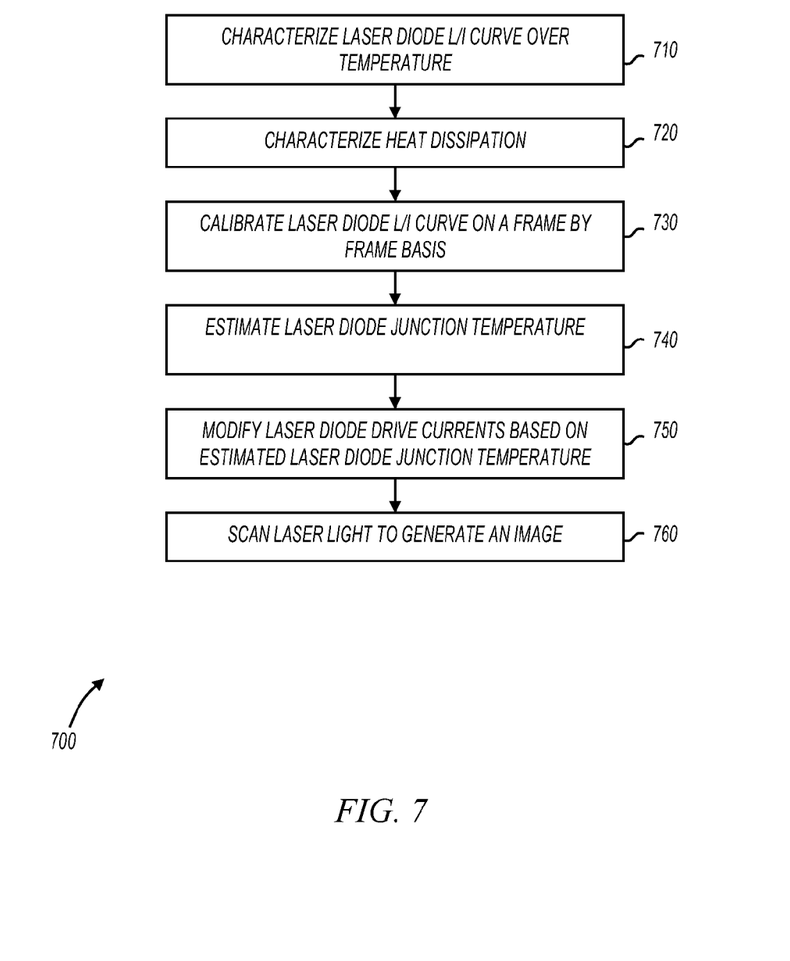
FIG. 7 shows a flow diagram of a method in accordance with various embodiments of the present invention.

FIG. 7 shows a flow diagram of methods in accordance with various embodiments of the present invention. In some embodiments, method 700, or portions thereof, is performed by a scanning laser projection apparatus, embodiments of which are shown in previous figures. In other embodiments, method 700 is performed by a series of circuits or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which one or more laser diodes are characterized over temperature. In some embodiments, this includes driving the laser diode with known current values at known diode junction temperatures and measuring the light output. This may include measuring light output for multiple drive currents at each diode junction temperature.

At 720, the heat dissipation characteristics of the laser diode are characterized. This may include measuring the rate at which heat dissipates from the laser diode junction as a function of various variables, such as ambient temperature, past drive values, laser diode voltage, and the like. This may also include modeling the geometry of the laser die, and matching the model variables with bench measurements of light output.

The characterizations described with reference to blocks 710 and 720 may be performed at any time. For example, the laser diode may be characterized during manufacture or after being integrated into a scanning laser projector, and also before or during the operational lifetime of the laser projector. Further, the head dissipation characteristics may be characterized when the laser diode is initially integrated into the scanning laser projector or may be characterized during the operational lifetime of the product. There is no limit to the number of times, or the times at which, these characterizations may take place.

The results of the characterizations may be loaded into one or more tables used to modify laser diode drive current values as a function of estimated diode junction temperatures. For example, one or more of gain table 316, offset table 314, and power table 312 may be populated based on the results obtained from the characterizations performed at 710 and 720.

At 730, the laser diode L/I curve is calibrated on a frame by frame basis. In some embodiments, this corresponds to calibration control circuits 140 commanding a known laser diode drive value and measuring the light output as part of a calibration sequence. This may be performed at any time, including during a vertical overscan as shown in FIG. 2. In some embodiments, this calibration is performed more or less frequently than on a frame by frame basis. For example, in some embodiments, a calibration sequence is performed every k frames, where k is greater than one. Also for example, a calibration sequence may be performed during a horizontal overscan, which may be performed more than once per frame.

At 740, the junction temperature of the laser diode is estimated. In some embodiments, this corresponds to the operation of junction temperature estimator 310. Junction temperature estimates may be made based on any available information, including one or more past drive values, heat dissipation characteristics, laser diode voltage, or the like. One or more infinite impulse response filters may be utilized to determine the junction temperature estimates. In some embodiments, the junction temperature estimates are made for each pixel to be displayed.

At 750, laser drive current values are modified based on estimated laser diode junction temperatures. In some embodiments, this corresponds to determining gain values and/or offset values as a function of temperature, and then applying the gain and/or offset values to the laser drive current values. This corresponds to the operation of any of the drive current generators described herein, including those shown in FIGS. 3-6.

At 760, laser light is scanned to generate an image. The laser light is modulated light that is generated by laser diode(s) driven by the laser diode drive currents modified at 750. In some embodiments, the scanning is performed by a MEMS device such as MEMS device 160.

Figure 8:
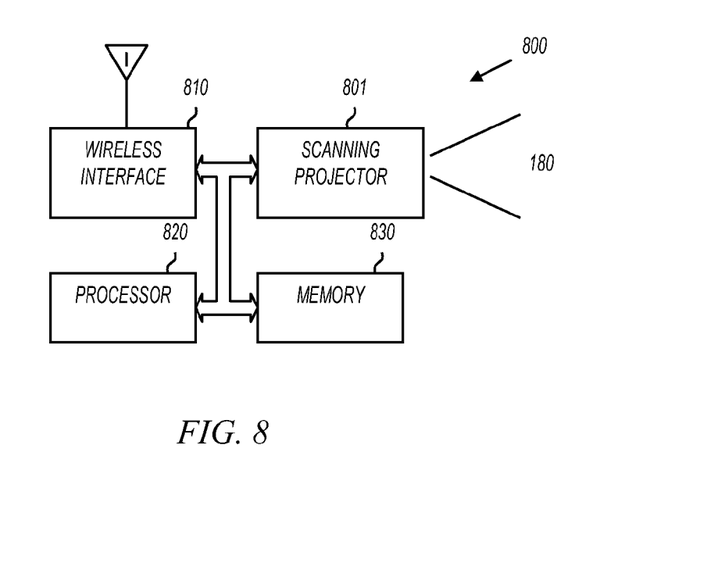
FIG. 8 shows a block diagram of a mobile device in accordance with various embodiments of the present invention.

FIG. 8 shows a block diagram of a mobile device in accordance with various embodiments of the present invention. As shown in FIG. 8, mobile device 800 includes wireless interface 810, processor 820, memory 830, and scanning projector 801. Scanning projector 801 paints a raster image at image plane 180. Scanning projector 801 includes one or more drive current generators and calibration circuits as described above with reference to previous figures. Scanning projector 801 may be any projection apparatus described herein.

Scanning projector 801 may receive image data from any image source. For example, in some embodiments, scanning projector 801 includes memory that holds still images. In other embodiments, scanning projector 801 includes memory that includes video images. In still further embodiments, scanning projector 801 displays imagery received from external sources such as connectors, wireless interface 810, a wired interface, or the like.

Wireless interface 810 may include any wireless transmission and/or reception capabilities. For example, in some embodiments, wireless interface 810 includes a network interface card (NIC) capable of communicating over a wireless network. Also for example, in some embodiments, wireless interface 810 may include cellular telephone capabilities. In still further embodiments, wireless interface 810 may include a global positioning system (GPS) receiver. One skilled in the art will understand that wireless interface 810 may include any type of wireless communications capability without departing from the scope of the present invention.

Processor 820 may be any type of processor capable of communicating with the various components in mobile device 800. For example, processor 820 may be an embedded processor available from application specific integrated circuit (ASIC) vendors, or may be a commercially available microprocessor. In some embodiments, processor 820 provides image or video data to scanning projector 801. The image or video data may be retrieved from wireless interface 810 or may be derived from data retrieved from wireless interface 810. For example, through processor 820, scanning projector 801 may display images or video received directly from wireless interface 810. Also for example, processor 820 may provide overlays to add to images and/or video received from wireless interface 810, or may alter stored imagery based on data received from wireless interface 810 (e.g., modifying a map display in GPS embodiments in which wireless interface 810 provides location coordinates).

Figure 9:
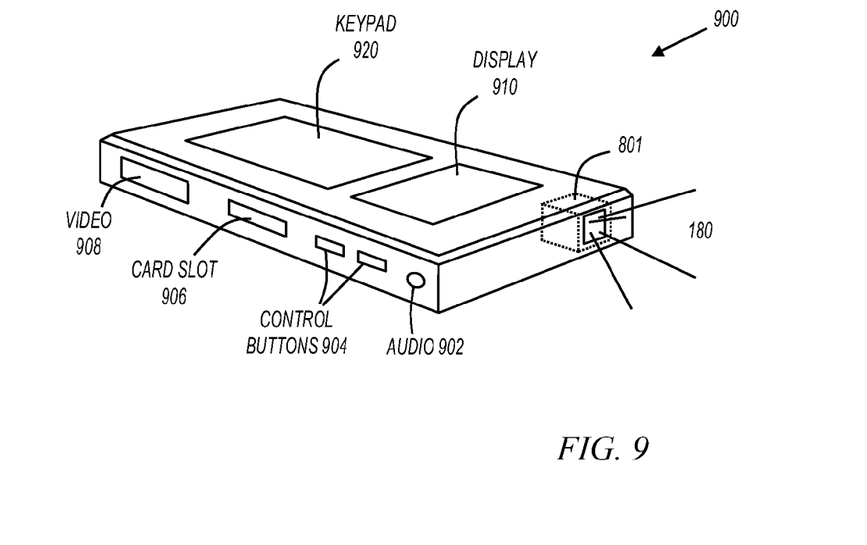
FIG. 9 shows a mobile device in accordance with various embodiments of the present invention.

FIG. 9 shows a mobile device in accordance with various embodiments of the present invention. Mobile device 900 may be a hand held projection device with or without communications ability. For example, in some embodiments, mobile device 900 may be a handheld projector with little or no other capabilities. Also for example, in some embodiments, mobile device 900 may be a device usable for communications, including for example, a cellular phone, a smart phone, a personal digital assistant (PDA), a global positioning system (GPS) receiver, or the like. Further, mobile device 900 may be connected to a larger network via a wireless (e.g., WiMax) or cellular connection, or this device can accept data messages or video content via an unregulated spectrum (e.g., WiFi) connection.

Mobile device 900 includes scanning projector 801 to create an image with light at image plane 180. Mobile device 900 also includes many other types of circuitry; however, they are intentionally omitted from FIG. 9 for clarity.

Mobile device 900 includes display 910, keypad 920, audio port 902, control buttons 904, card slot 906, and audio/video (A/V) port 908. None of these elements are essential. For example, mobile device 900 may only include scanning projector 801 without any of display 910, keypad 920, audio port 902, control buttons 904, card slot 906, or A/V port 908. Some embodiments include a subset of these elements. For example, an accessory projector product may include scanning projector 801, control buttons 904 and A/V port 908.

Display 910 may be any type of display. For example, in some embodiments, display 910 includes a liquid crystal display (LCD) screen. Display 910 may always display the same content projected at image plane 180 or different content. For example, an accessory projector product may always display the same content, whereas a mobile phone embodiment may project one type of content at image plane 180 while displaying different content on display 910. Keypad 920 may be a phone keypad or any other type of keypad.

A/V port 908 accepts and/or transmits video and/or audio signals. For example, A/V port 908 may be a digital port that accepts a cable suitable to carry digital audio and video data such as a high definition multimedia interface (HDMI) port. Further, A/V port 908 may include RCA jacks to accept composite inputs. Still further, A/V port 908 may include a VGA connector to accept analog video signals. In some embodiments, mobile device 900 may be tethered to an external signal source through A/V port 908, and mobile device 900 may project content accepted through A/V port 908. In other embodiments, mobile device 900 may be an originator of content, and A/V port 908 is used to transmit content to a different device.

Audio port 902 provides audio signals. For example, in some embodiments, mobile device 900 is a media player that can store and play audio and video. In these embodiments, the video may be projected at image plane 180 and the audio may be output at audio port 902. In other embodiments, mobile device 900 may be an accessory projector that receives audio and video at A/V port 908. In these embodiments, mobile device 900 may project the video content at image plane 180, and output the audio content at audio port 902.

Mobile device 900 also includes card slot 906. In some embodiments, a memory card inserted in card slot 906 may provide a source for audio to be output at audio port 902 and/or video data to be projected at image plane 180. Card slot 906 may receive any type of solid state memory device, including for example, Multimedia Memory Cards (MMCs), Memory Stick DUOS, secure digital (SD) memory cards, and Smart Media cards. The foregoing list is meant to be exemplary, and not exhaustive.

Figure 10:
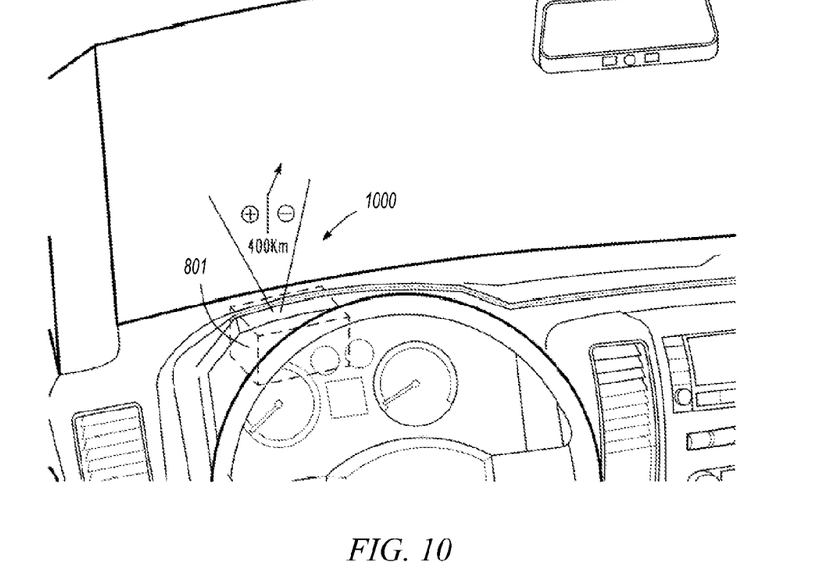
FIG. 10 shows a head-up display system in accordance with various embodiments of the invention.

FIG. 10 shows a head-up display system in accordance with various embodiments of the invention. Projector 801 is shown mounted in a vehicle dash to project the head-up display at 1000. Although an automotive head-up display is shown in FIG. 10, this is not a limitation of the present invention. For example, various embodiments of the invention include head-up displays in avionics application, air traffic control applications, and other applications.

Figure 11:
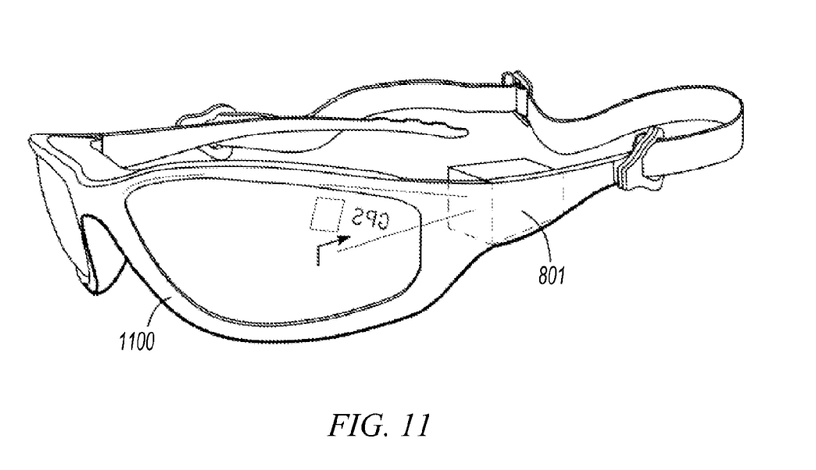
FIG. 11 shows eyewear in accordance with various embodiments of the invention.

FIG. 11 shows eyewear in accordance with various embodiments of the invention. Eyewear 1100 includes projector 801 to project a display in the eyewear's field of view. In some embodiments, eyewear 1100 is see-through and in other embodiments, eyewear 1100 is opaque. For example, eyewear may be used in an augmented reality application in which a wearer can see the display from projector 801 overlaid on the physical world. Also for example, eyewear may be used in a virtual reality application, in which a wearer's entire view is generated by projector 801. Although only one projector 801 is shown in FIG. 11, this is not a limitation of the present invention. For example, in some embodiments, eyewear 1100 includes two projectors; one for each eye.

Figure 12:
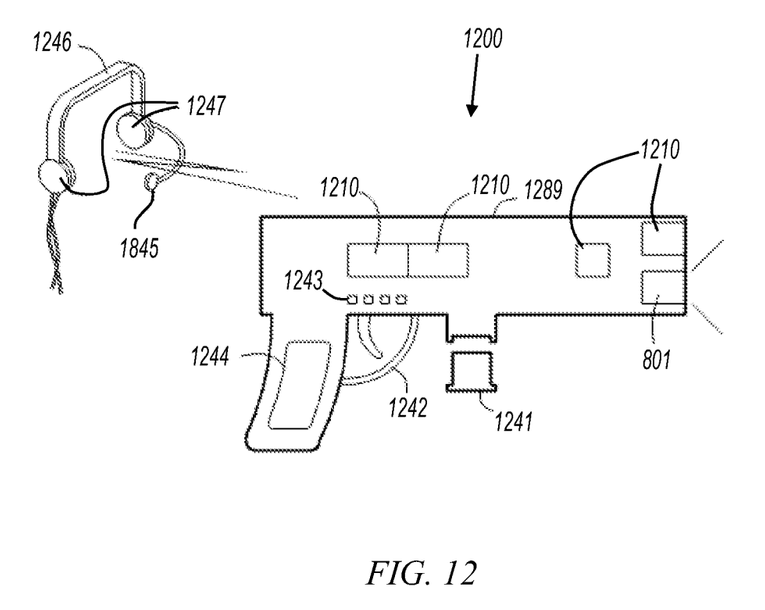
FIG. 12 shows a gaming apparatus in accordance with various embodiments of the present invention.

FIG. 12 shows a gaming apparatus in accordance with various embodiments of the present invention. Gaming apparatus 1200 allows a user or users to observe and interact with a gaming environment. The game is navigated based on the motion, position or orientation of gaming apparatus 1200, an apparatus that includes projection apparatus 801. Other control interfaces, such as manually-operated buttons, foot pedals, or verbal commands, may also contribute to navigation around, or interaction with the gaming environment. For example, in some embodiments, trigger 1242 contributes to the illusion that the user or users are in a first person perspective video game environment, commonly known as a "first person shooter game." Because the projected display can be controlled by the gaming application in combination with the user's movement, gaming apparatus 1200 creates a highly believable or "immersive" environment for these users.

Many other first person perspective simulations can also be created by gaming apparatus 1200, for such activities as 3D seismic geo-prospecting, spacewalk planning, jungle canopy exploration, automobile safety instruction, medical education, etc. Tactile interface 1244 may provide a variety of output signals, such as recoil, vibration, shake, rumble, etc. Tactile interface 1244 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 1200 may also include audio output devices, such as integrated audio speakers, remote speakers, or headphones. These sorts of audio output devices may be connected to gaming apparatus 1200 with wires or through a wireless technology. For example, wireless headphones 1246 provide the user with sound effects via a Bluetooth connection, although any sort of similar wireless technology could be substituted freely. In some embodiments, wireless headphones 1246 may include microphone 1245 or binaural microphone 1247, to allow multiple users, instructors, or observers to communicate. Binaural microphone 1247 typically includes microphones on each ear piece, to capture sounds modified by the user's head shadow. This feature may be used for binaural hearing and sound localization by other simulation participants.

Gaming apparatus 1200 may include any number of sensors 1210 that measure distance, ambient brightness, motion, position, orientation, and the like. For example, gaming apparatus 1200 may detect absolute heading with a digital compass, and detect relative motion with an x-y-z gyroscope or accelerometer. In some embodiments, gaming apparatus 1200 also includes a second accelerometer or gyroscope to detect the relative orientation of the device, or its rapid acceleration or deceleration. In other embodiments, gaming apparatus 1200 may include a Global Positioning Satellite (GPS) sensor, to detect absolute position as the user travels in terrestrial space.

Gaming apparatus 1200 may include battery 1241 and/or diagnostic lights 1243. For example, battery 1241 may be a rechargeable battery, and diagnostic lights 1243 could indicate the current charge of the battery. In another example, battery 1241 may be a removable battery clip, and gaming apparatus 1200 may have an additional battery, electrical capacitor or super-capacitor to allow for continued operation of the apparatus while the discharged battery is replaced with a charged battery. In other embodiments, diagnostic lights 1243 can inform the user or a service technician about the status of the electronic components included within or connected to this device. For example, diagnostic lights 1243 may indicate the strength of a received wireless signal, or the presence or absence of a memory card. Diagnostic lights 1243 could also be replaced by any small screen, such as an organic light emitting diode or liquid crystal display screen. Such lights or screens could be on the exterior surface of gaming apparatus 1200, or below the surface, if the shell for this apparatus is translucent or transparent.

Other components of gaming apparatus 1200 may be removable, detachable or separable from this device. For example, the projection apparatus 801 may be detachable or separable from gaming housing 1249. In some embodiments, the subcomponents of the projection apparatus 801 may be detachable or separable from gaming housing 1249, and still function.

As described above, various embodiments of the present invention combine a low-speed calibration method and apparatus with a high-speed temperature prediction based correction method and apparatus. The gain/offset calibration may be used in both cases, but the slow speed gain adjuster is combined with a high-speed (predictive) gain correcter, and the slow speed offset adjuster is combined with a high-speed (predictive) offset corrector.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
 a laser diode coupled to be responsive to a drive signal;
 a junction temperature estimator to create an estimate of a junction temperature of the laser diode;
 a calibration control circuit to periodically measure optical power from the laser diode and generate a calibration gain value and a calibration offset value; and
 at least one device that includes a table of gain values and a table of offset values used to modify the drive signal as a function of the estimate of the junction temperature, wherein the at least one device further includes at least one multiplier to modify the drive signal using the calibration gain value and a gain value from the table of gain values, and at least one adder to modify the drive signal using the calibration offset value and an offset value from the table of offset values.

2. The apparatus of claim 1 wherein the estimate is determined as a function of past drive signal values.

3. The apparatus of claim 2 further including a table that maps past drive signal values to deposited power values, wherein the estimate is determined as a function of the deposited power values.

4. The apparatus of claim 1 wherein the junction temperature estimator includes at least one infinite impulse response filter.

5. The apparatus of claim 1 wherein the estimate is determined as a function of ambient temperature.

6. The apparatus of claim 1 wherein the at least one device includes a table of current offset values as a function of junction temperature.

7. The apparatus of claim 1 wherein the at least one device includes a table of gain values as a function of junction temperature.

8. A projection apparatus comprising:
 a scanning mirror to scan modulated laser light and display pixels;

at least one laser diode coupled to be responsive to a drive current value, and to create the modulated laser light; and a calibration control circuit to perform a calibration sequence that occurs less frequently than every pixel by periodically measuring optical power from the at least one laser diode and generating a calibration gain value and a calibration offset value; and a drive current generator to generate the drive current value, wherein the drive current generator creates the drive current value by multiplying a nominal drive value with the calibration gain value and a drive current gain, and then adding the calibration offset value and a drive current offset, wherein the drive current gain and the drive current offset are retrieved from tables driven by a junction temperature estimator that estimates a junction temperature of the at least one laser diode for every pixel.

9. The projection apparatus of claim 8 wherein the calibration sequence is performed once per frame of pixels.

10. The projection apparatus of claim 8 wherein the calibration sequence is performed less than once per frame of pixels.

11. The projection apparatus of claim 8 wherein the at least one laser diode includes red, green, and blue laser diodes, further comprising a plurality of drive current generators, each of the plurality of drive current generators being coupled to generate drive current values for a corresponding one of the red, green, and blue laser diodes.

12. The projection apparatus of claim 11 wherein each of the plurality of drive current generators includes a table that maps past drive current values to power values that represent power input to the laser diode junction.

13. The projection apparatus of claim 11 wherein each of the plurality of drive current generators includes a table of offset values that provides the drive current offset as a function of estimated laser diode junction temperature.

14. The projection apparatus of claim 13 wherein each of the plurality of drive current generators includes an adder to sum the drive current offset provided by the table of offset values with the calibration offset value.

15. The projection apparatus of claim 8 wherein the calibration offset approximates a threshold current for the at least one laser diode.

16. An apparatus comprising:
a first circuit to remove luminance-to-current calibration effects from a laser diode drive signal value, wherein the first circuit comprises a subtractor to remove a previously applied offset value;

a laser diode junction temperature estimator to estimate a laser diode junction temperature as a function of past laser diode drive signal values; and a second circuit to modify the laser diode drive signal value in response to the laser diode junction temperature estimator, wherein the second circuit comprises a gain table responsive to the laser diode junction temperature estimator to provide a gain value to be multiplied with the laser diode drive signal value, an offset table responsive to the laser diode junction temperature estimator to provide an offset value to be summed with the laser diode drive signal value, and an adder to add back in the previously applied offset value.

17. The apparatus of claim 16 wherein the laser diode junction temperature estimator comprises at least one infinite impulse response filter responsive to the past laser diode drive signal values.

* * * * *